(12) United States Patent
Ono

(10) Patent No.: US 7,224,423 B2
(45) Date of Patent: May 29, 2007

(54) DOUBLE-SIDED LCD DEVICE COMPRISING CIRCUIT BOARDS AND TAPE CARRIER PACKAGES

(75) Inventor: Shin-Ichirou Ono, Kawasaki (JP)

(73) Assignee: NEC LCD Technologies, Ltd., Kanagawa (JP)

(*) Notice: Subject to any disclaimer, the term of this patent is extended or adjusted under 35 U.S.C. 154(b) by 310 days.

(21) Appl. No.: 10/952,737

(22) Filed: Sep. 30, 2004

(65) Prior Publication Data
US 2005/0068486 A1  Mar. 31, 2005

(30) Foreign Application Priority Data
Sep. 30, 2003  (JP) ............................. 2003-339229

(51) Int. Cl.
*G02F 1/1345* (2006.01)
(52) U.S. Cl. .................. 349/150; 349/65; 362/630; 362/631
(58) Field of Classification Search ........ 349/150–152, 349/65, 61, 62, 69, 70; 362/630, 631
See application file for complete search history.

(56) References Cited

U.S. PATENT DOCUMENTS 6,738,121 B2 * 5/2004 Yun et al. .................. 349/149

FOREIGN PATENT DOCUMENTS

| JP | 64-84292 | 3/1989 |
| JP | 7-43688 | 2/1995 |

* cited by examiner

*Primary Examiner*—Thoi V. Duong
(74) *Attorney, Agent, or Firm*—Young & Thompson

(57) ABSTRACT

A double-sided LCD device includes a double-sided backlight unit, front and rear LCD panels, and first and second circuit boards connected to the front and rear LCD panels, respectively, by TCPs. Each TCP has first and second slits for bending the TCP. The TCP connecting the first circuit board to the front LCD panel is bent at the second slit, whereas the TCP connecting the second circuit board to the rear LCD panel is bent at the first slit, to achieve overlapping arrangement of the first and second circuit boards as viewed parallel to the LCD panels.

9 Claims, 11 Drawing Sheets

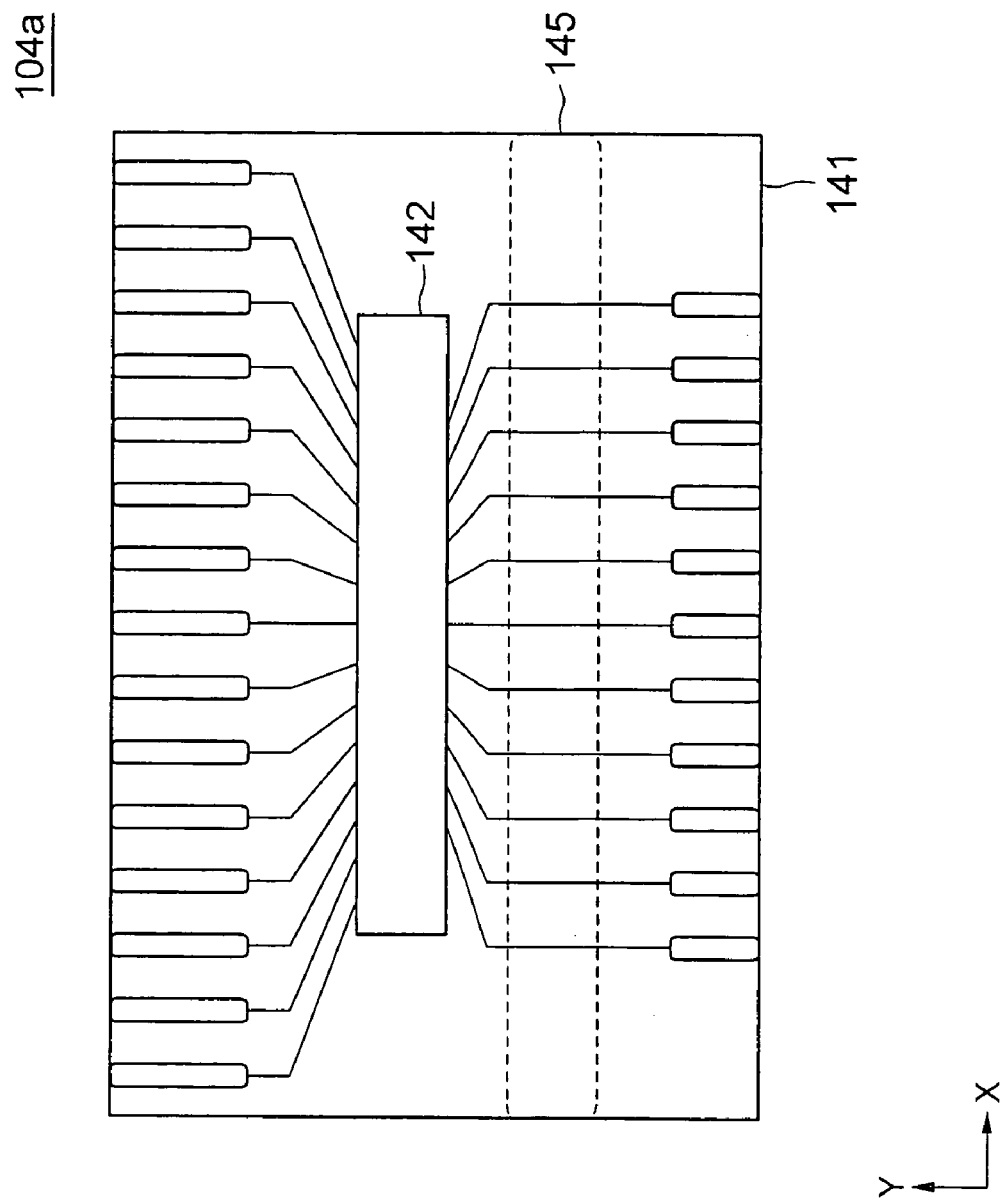

FIG. 6A
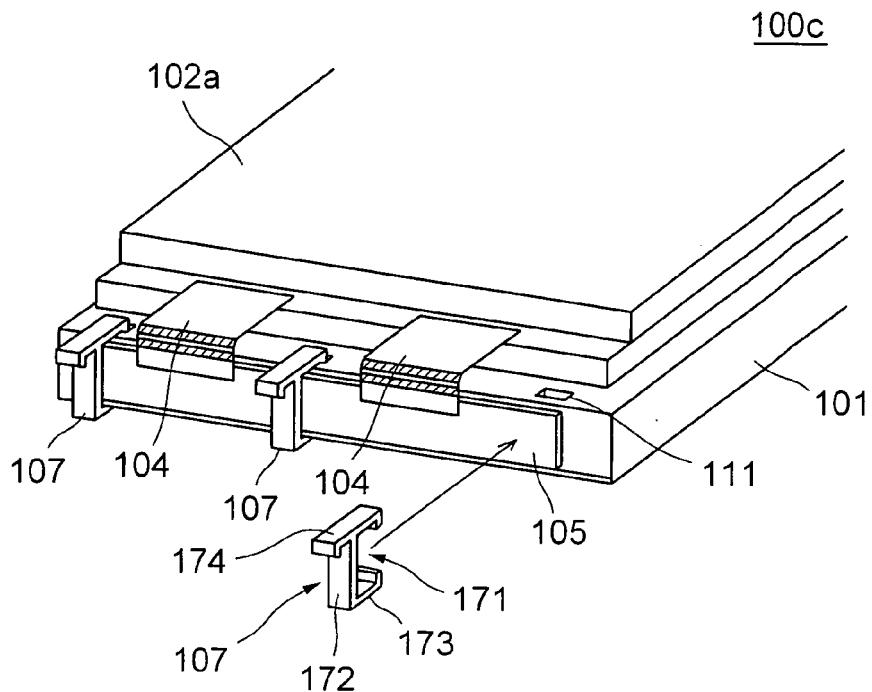
FIG. 6B
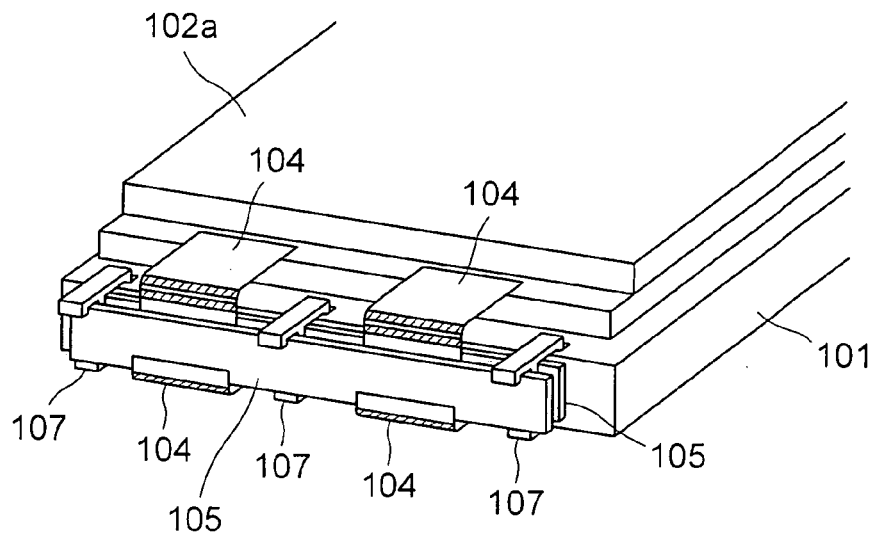
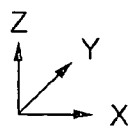

DOUBLE-SIDED LCD DEVICE COMPRISING CIRCUIT BOARDS AND TAPE CARRIER PACKAGES

BACKGROUND OF THE INVENTION (a) Field of the Invention

The present invention relates to a double-sided LCD (liquid crystal display) device and, more particularly, to a double-sided LCD device including front and rear LCD panels.

(b) Description of the Related Art

A large number of types of LCD devices have been used in a variety of applications. A double-sided LCD device is one of the types of the LCD devices, having front and rear LCD panels, which are coupled together in a back-to-back fashion. The LCD panels used in the double-sided LCD device generally have the same size and are generally used in the advertisement in a station or on a train.

FIG. 9 shows a conventional double-sided LCD device. The LCD device, generally designated by numeral 200, includes front and rear LCD panels 202, a backlight unit 201 sandwiched therebetween, and a shield frame 203 receiving therein the peripheral portions of the LCD panels 202 and the backlight unit 201. In the exemplified configuration, tape carrier packages (TCPs) 204 each mounting thereon a driver IC (not shown) and an interconnect pattern (not shown) extend linearly from the peripheries of the LCD panels 202 toward circuit boards 205. The driver ICs drive data lines and gate lines in the LCD panels 202.

The basic function of the circuit boards 205 is to electrically couple together the TCPs 204 and external circuits, and thus the circuit boards 205 may be referred to as coupling boards. In some cases, the circuit boards 205 may include therein control circuits and/or power supply circuits for driving the LCD panels 202. The depicted structure has the advantage of a smaller thickness and the disadvantage of a larger peripheral area disposed around the effective display area, due to the TCPs 204 extending linearly.

FIG. 10 shows a sectional view of another conventional double-sided LCD device 200a, described in Patent Publication JP-A-7(1995)-43688. In FIGS. 9 and 10 as well as the following figures, similar constituent elements are designated by similar reference numerals. In the structure depicted in FIG. 10, a pair of LCD modules 210 each including therein an LCD panel 202, TCPs 204 and circuit boards 205 are disposed in a plane symmetry with respect to a central plane passing through the central line of a lamp 206. The TCPs 204 are bent in an L-shaped structure, whereby the circuit boards 205 extends normal to the LCD panels 202 to achieve the advantage of a smaller peripheral area for the LCD panels 202. The LCD device of FIG. 10 has, however, the disadvantage of a larger thickness due to the two circuit boards 205 extending normal to the LCD panels 202 in succession.

FIG. 11 shows another conventional double-sided LCD device 200b, described in Patent Publication JP-A-64 (1989)-84292. In the depicted structure, a pair of LCD modules 211 each having a configuration similar to that of FIG. 10 are disposed so that the circuit boards 205 are slightly deviated from one another in the extending direction of the LCD panels 202 to thereby allow the circuit boards 105 to be juxtaposed with each other. This reduces the thickness of the LCD device 200b while achieving a smaller peripheral area.

In the structure of FIG. 11, there is a disadvantage, however, in that the center of the lamp 206 is not aligned with the center of at least one of the LCD panels 202, as understood from FIG. 11. Thus, the distance between the lamp center and one edge of the at least one of the LCD panels 202 is different from the distance between the lamp center and the other edge of the at least one of the LCD panels 202, thereby generating ununiformity of the brightness of the screen of the at least one of the LCD panels 202 to degrade the image quality. In addition, the deviation of the arrangement between the front and rear LCD panels increases the peripheral area for the LCD device.

SUMMARY OF THE INVENTION

It is an object of the present invention to provide a double-sided LCD device having a reduced peripheral area for each of the LCD panels and a reduced overall thickness of the LCD device.

The present invention provides a double-sided liquid crystal display (LCD) device including: a backlight unit having front and rear light-emitting surfaces; front and rear LCD panels disposed on the front and rear light-emitting surfaces, respectively; first and second circuit boards disposed parallel to an edge surface of the backlight unit at different distances with respect to the edge surface; and front and rear tape carrier packages (TCPs), the front TCP connecting the front LCD panel to the first circuit board, the rear TCP connecting the rear LCD panel to the second panel, each of the TCPs having a plurality of bendable positions, the front and rear TCPs being bent at different bendable positions to achieve the different distances with respect to the edge surface.

In accordance with the double-sided LCD device of the present invention, due to the different bend positions of the TCPs, the circuit boards connected to the front and rear LCD panels can be disposed to overlap with each other above the edge surface of the backlight unit, whereby the double-sided LCD device of the present invention has a reduced peripheral area as well as a smaller thickness. In addition, both the TCPs can be manufactured with the same design, thereby reducing the number of types of the TCPs and simplifying the fabrication process for the double-sided LCD device.

The above and other objects, features and advantages of the present invention will be more apparent from the following description, referring to the accompanying drawings.

BRIEF DESCRIPTION OF THE DRAWINGS

FIG. 4 is a top plan view of the TCP shown in FIG. 3.

FIGS. 5A and 5B are perspective views of a double-sided LCD device according to a third embodiment of the present invention, wherein FIG. 5A shows the LCD device with a top circuit board for the rear LCD panel in FIG. 5B being removed therefrom for showing a bottom circuit board for the front LCD panel.

FIGS. 6A and 6B are perspective views showing, similarly to FIGS. 5A and 5B, respectively, a double-sided LCD device according to a fourth embodiment of the present invention.

PREFERRED EMBODIMENT OF THE INVENTION

Figure 1:
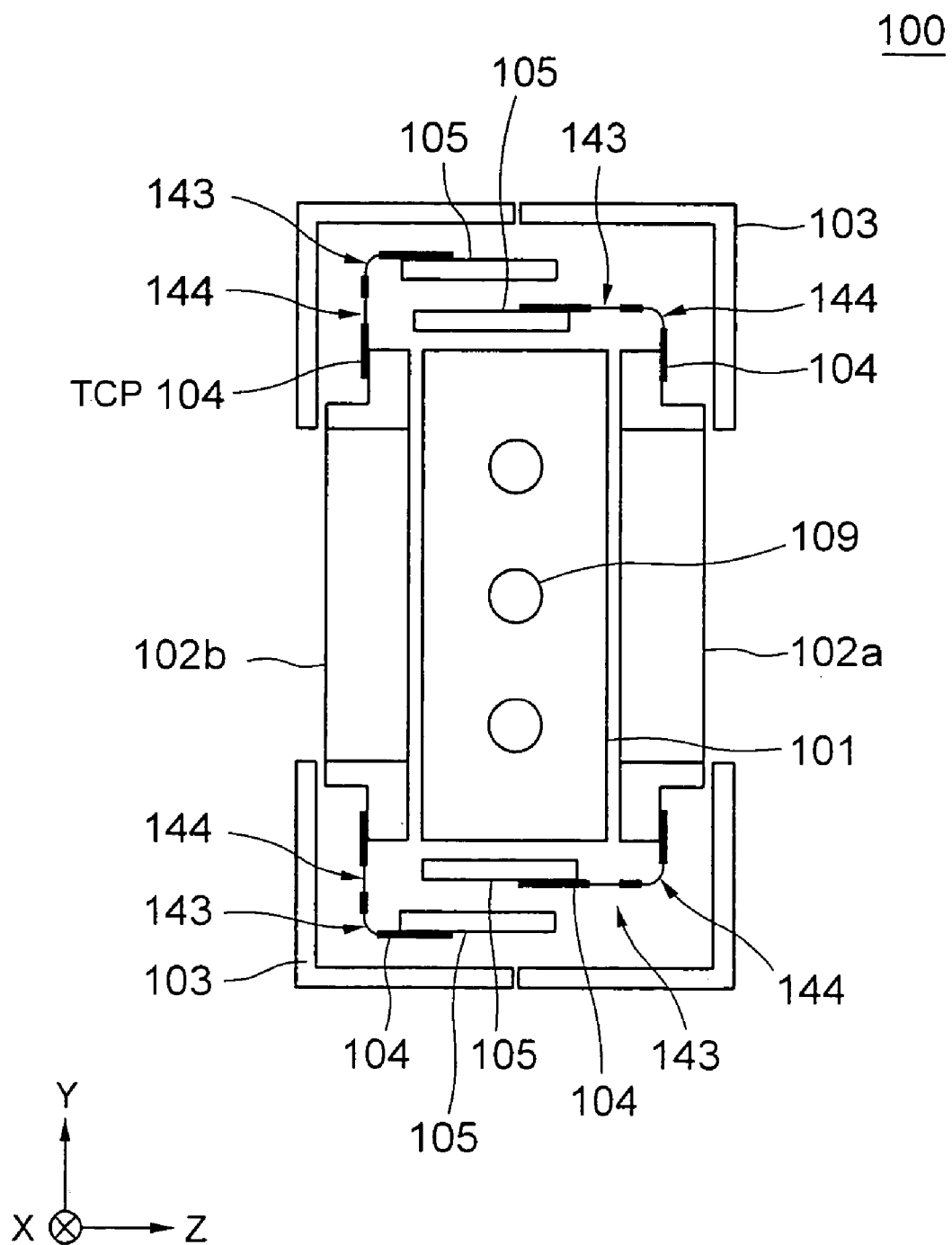
FIG. 1 is a sectional view of a double-sided LCD device according to a first embodiment of the present invention.

Now, the present invention is more specifically described with reference to accompanying drawings, wherein similar constituent elements are designated by similar reference numerals in the embodiments.

Referring to FIG. 1, a double-sided LCD device, generally designated by numeral 100, according to a first embodiment of the present invention includes a double-sided backlight unit 101, front and rear LCD panels 102a and 102b disposed on the front and rear surfaces, respectively, of the backlight unit 101, and a shield frame 103 for receiving therein peripheral areas of the LCD panels 102a and 102b and the backlight unit 101. A plurality of TCPs 104 connected to an edge portion of one of the LCD panels 102a and 102b is connected to a circuit board 105 located on or apart from the corresponding edge surface of the backlight unit 101. The shield frame 103 also receives therein the TCPs 104 and circuit boards 105.

The double-sided backlight unit 101 has light dispersion plates acting as light emitting surfaces on the front and rear sides thereof. The double-sided backlight unit 101 includes a plurality of lamps 109 between the light emitting surfaces thereof, to configure a direct-emission backlight unit. The backlight unit 101 may be replaced by a pair of single-sided backlight units bonded together in a back-to-back structure. Each LCD panel 102 (102a or 102b) includes, for example, an active-matrix glass substrate mounting thereon an array of active elements, a counter glass substrate opposing the active-matrix glass substrate, and a liquid crystal (LC) layer sandwiched therebetween for controlling transmittance for the light emitted from the backlight unit 101. Each circuit board 105 mounts thereon a data-signal drive circuit (X-drive circuit) for generating signals for the data lines, or a gate-signal drive circuit (Y-drive circuit) for generating signals for the gate lines.

Figure 2:
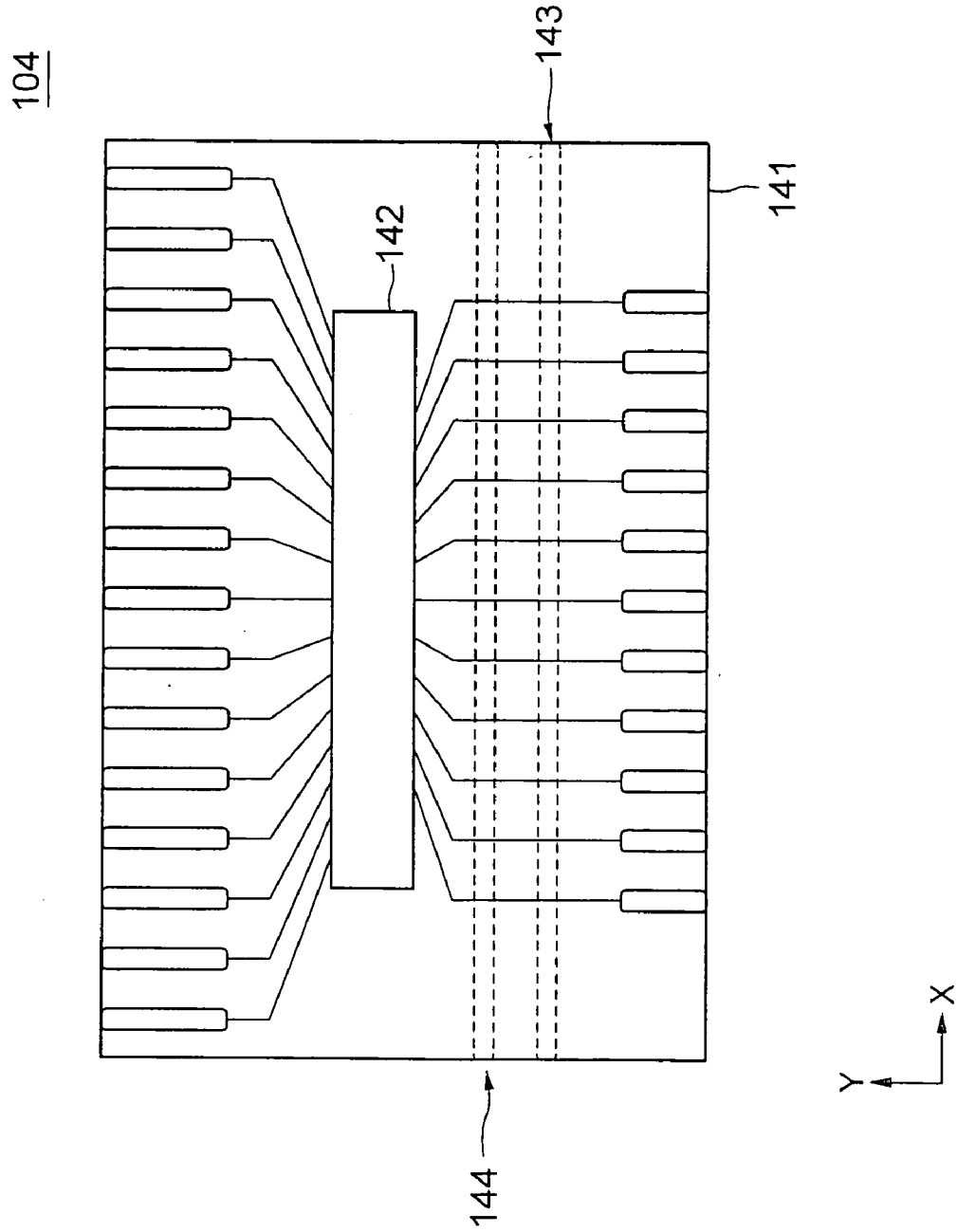
FIG. 2 is a top plan view of the TCP shown in FIG. 1.

Referring to FIG. 2, the TCP 104 has a width of around 20 to 40 mm in X-direction, and a length of around 20 to 30 mm in the Y-direction, for example. The base substrate 141 of the TCP 104 is made of a plastic film such as polyimide, on which a driver chip 142 is mounted for driving the gate lines or data lines on the LCD panel 102. The driver chip 142 has a 10 mm×1.5 mm size, for example.

The base substrate 141 includes a first slit 143 and a second slit 144 disposed apart from each other, each of the slits 143 and 144 having a width of around 1 mm in the Y-direction. Each slit 143 or 144 may be formed by etching a portion of the base substrate 141, on which the driver chip 142 is not disposed, to form a slit opening, and filling the slit opening with resin etc. The thus formed slit 143 or 144 has a more flexibility than the other portion of the base substrate 141, whereby the TCP 104 can be bent without difficulty at both the slits 143 and 144.

Back to FIG. 1, each of the LCD panels 102a and 102b is of a rectangular shape, wherein at least one edge of the LCD panel 102a or 102b extending in each of X- and Y-directions is connected to the circuit board 105 via a corresponding group of TCPs 104. In the arrangement of the double-sided LCD device 100, the circuit board 105 connected to the front LCD panel 102a interferes with the circuit board 105 connected to the rear LCD panel 102b, as viewed parallel to the LCD panels 102a and 102b.

For avoiding the actual interference between the circuit boards 105 for the front and rear LCD panels 102a and 102b in the vicinity of each edge surface of the backlight unit 101, the TCPs 104 connected to the front LCD panel 102a are bent at the second slits 144 in an L-shaped structure whereas the TCPs 104 connected to the rear LCD panel 102b are bent at the first slits 143 in an L-shaped structure.

The TCPs 104 bent at the second slits 144 and the first slits 143 allow the circuit boards 105 to be located at different distances from the edge surface of the backlight unit 101, thereby canceling the interference between the circuit boards 105, as shown in FIG. 1. The spacing between the first slit 143 and the second slit 144 is determined so that the two circuit boards 105 do not interfere with each other, and may be 2 to 3 mm, for example, depending on the thickness of the components mounted on the circuit boards 105.

In the present embodiment, the TCPs 104 connected to the front and rear LCD panels 102a and 102b are manufactured with the same design and are bent at different slits 143 and 144 for avoiding the interference and reducing the thickness of the double-sided LCD device. This is achieved while using the LCD panels 102a and 102b manufactured with the same design and arranging both the LCD panels 102a and 102b with the center lines thereof being aligned. This configuration also reduces the peripheral area of the LCD panels.

In general, the conventional TCP 104 has a single slit at the desired bend portion of the TCP. If such TCPs are used in the double-sided LCD device 100, two types of the TCPs having respective single slits at different positions must be prepared for avoiding the interference between the circuit boards 105. This increases the number of types of the TCPs prepared for the double-sided LCD device, and also complicates the fabrication process for the LCD device to raise the cost of the TCPs. In the present embodiment, one of the two slits 143 and 144 can be selected in the TCP 104 for avoiding the interference.

Figure 3:
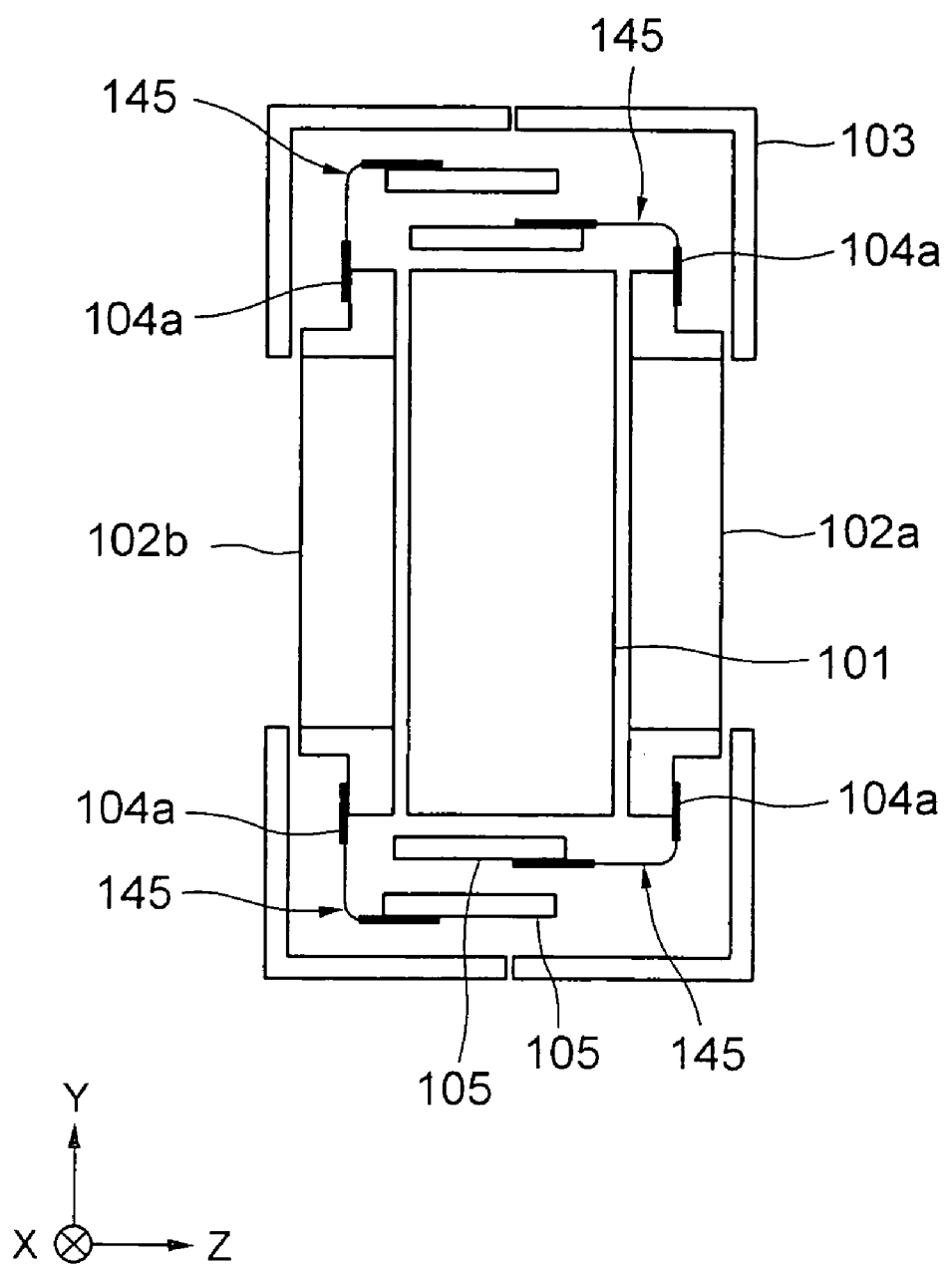
FIG. 3 is a sectional view of a double-sided LCD device according to a second embodiment of the present invention.

Referring to FIG. 3, a double-sided LCD device, generally designated by numeral 100a, according to a second embodiment of the present invention is similar to the first embodiment except for the structure of the TCPs. More specifically, each TCP 104a in the present embodiment has a single slit 145 having a larger width. FIG. 4 shows the detail of the TCP 104a including the large-width slit 145 having a width as large as 3 mm, for example. The TCP 104a can be bent at any position within the slit 145 in the Y-direction. As shown in FIG. 3, the TCP 104a connected to the front LCD panel 102a is bent at the position nearer to the LCD panel 102a compared to the TCP 104a connected to the rear LCD panel 102b.

The different positions of the bends within the slit 145 for both the TCPs 104a connected to the LCD panels 102a and 102b cancel the interference between the circuit boards 105, as shown in FIG. 3, similarly to the first embodiment. The configuration of the second embodiment allows the position of the bend for the TCP 104a to be selected as desired.

Figure 5A:
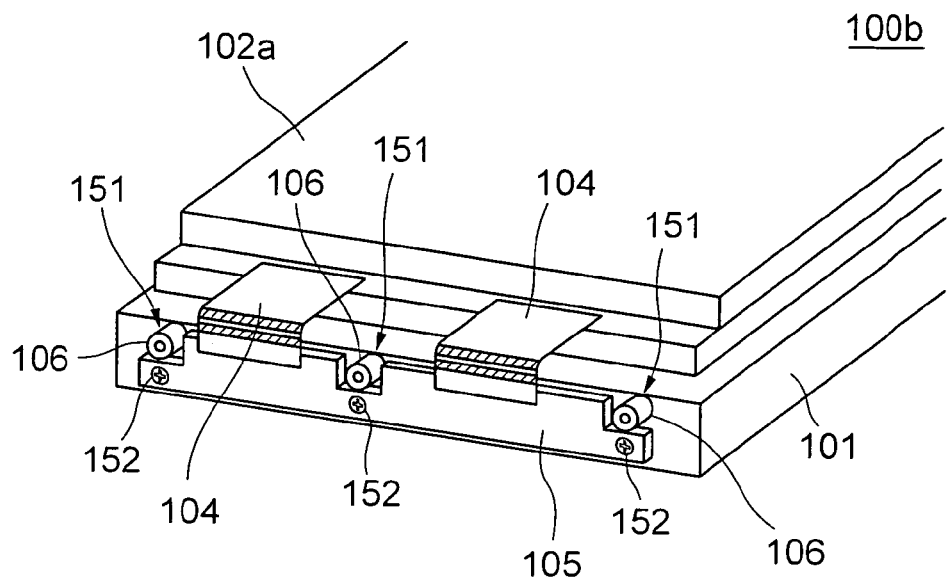
Figure 5B:
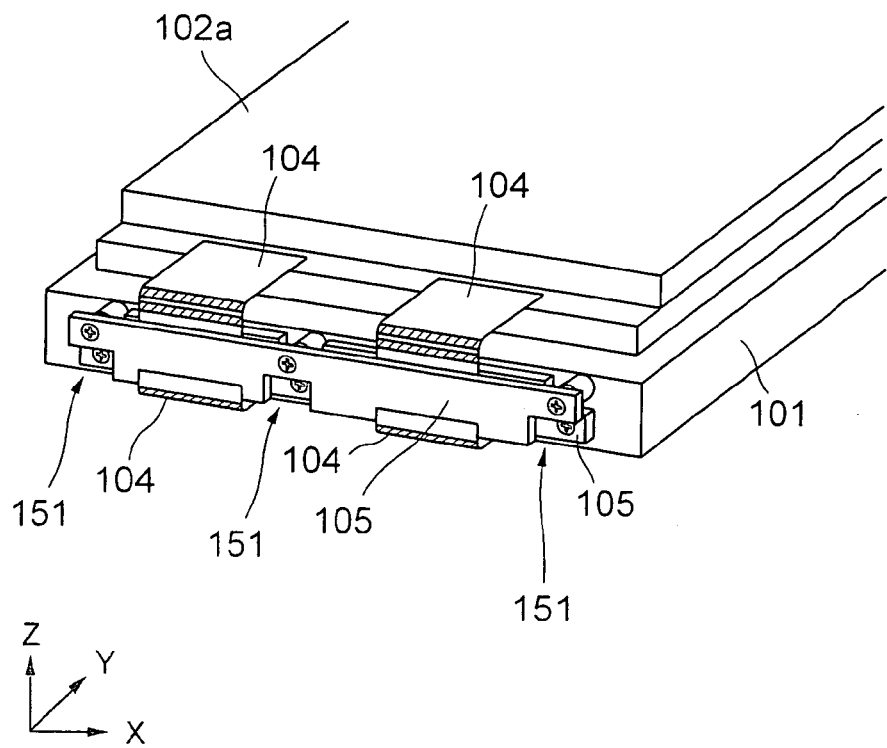

FIGS. 5A and 5B show the supporting structures for the circuit boards 105 in a double-sided LCD device, generally designated by numeral 104b, according to a third embodiment of the present invention. In this embodiment, the circuit boards 105 are fixed to the backlight unit 101 by using screws 152. The TCPs 104 are similar to those used in the first embodiment and each has two slits.

FIG. 5A shows the state wherein one of the circuit boards, bottom circuit board 105, is supported by the backlight unit 101 with screws 152, whereas FIG. 5B shows the state wherein both the circuit boards, top and bottom circuit boards 105, are supported by the backlight unit 101 with screws 152. The screws 152 for the bottom circuit board 105 connected to the front LCD panel 102a are received in the screw holes formed on the edge surface of the backlight unit 101, whereas the screws 152 for the top circuit board 105 for the rear LCD panel 102b are received in bosses 106 attached onto the edge surface of the backlight unit 101. The screw holes and bosses 106 cancel the interference between the circuit boards 105 in this arrangement. Each circuit board 105 mounts thereon IC chips on the surface of the circuit board 105 far from the edge surface of the backlight unit 101. Each circuit board 105 has a cutout 151 at the position corresponding to each screw 152 for the other of the circuit boards 105.

In fabrication of the double-sided LCD device 100b of the present embodiment, a front LCD panel 102a connected with TCPs 104 is first mounted on the front surface of the double-sided backlight unit 101. A group of TCPs 104, which are connected to a common circuit board 105 at the distal ends thereof, are then bent at the respective second slits 144, to allow the circuit board 105 to be in contact with the edge surface of the backlight unit 101. The circuit board 105 is then fixed onto the edge surface of the backlight unit 101 with screws 152.

Subsequently, a rear LCD panel 102b connected with TCPs 104 is mounted on the rear surface of the backlight unit 101. A group of TCPs 104, which are connected to another circuit board 105, are then bent at the respective first slits 143, to allow the circuit board 105 to be disposed in contact with the tops of the bosses 106. The circuit board 105 is then fixed onto the tops of the bosses 106 with screws 152. Both the circuit boards 105 have substantially the same shape except for the locations of the cutouts 151. The resultant structure including the LCD panels 102a and 102b and the backlight unit 101 are then received in the frame shield 103.

As described above, both the circuit boards 105 are suitably fixed onto the backlight unit 101, with a suitable gap being disposed therebetween, by using the screws 152 and bosses 106. The structure of the support for both the circuit boards 105 is simple, and can be manufactured at a low cost.

FIGS. 6A and 6B show, similarly to FIGS. 5A and 5B, respectively, the support structure for the circuit boards 105 in a double-sided LCD device, generally designated by numeral 104c, according to a fourth embodiment of the present invention. The LCD device 100c of the present embodiment is similar to the third embodiment except for the support structure for supporting the circuit boards 105.

More specifically, the LCD device 100c includes a plurality of support members 107 for fixing the circuit boards 105 with respect to the edge surface of the backlight unit 101. The support member 107 has a basic structure of a resin stripe plate formed by molding, for example. The support member 107 has a "C"-shaped portion 171 with right-angle corners, as viewed from the side of the support member 107, that includes a central stripe 172 and two forward extensions 173 each having a hook at the tip thereof. The support member 107 also has a backward extension 174 extending from the C-shaped portion 171 and having a hook at the tip of the backward extension 174. The support member 107 is elastic, and has a spring function. Opposing two hooks of the C-shaped portion 171 are received in the front and rear holes 111 disposed in the vicinity of the edge surface of the backlight unit 101. The bottom circuit board 105 connected to the front LCD panel 102a is pressed onto the edge surface of the backlight unit 101 via the central stripe 172, whereas the top circuit board 105 connected to the rear LC panel 102b is held between the central stripe 172 and the hook of the backward extension 174.

In fabrication of the LCD device 100c of the present embodiment, a front LCD panel 102a connected with TCPs 104 is mounted on the front surface of the backlight unit 101. A group of TCPs 104, which are connected to a single circuit board 105 on the distal ends thereof, are then bent at the second slits 144 to allow the bottom circuit board 105 to be in contact with the edge surface of the backlight unit 101. Support members 107 are then attached to the backlight unit 101 by inserting the opposing hooks of the support members 107 into the holes 111 of the backlight unit 101, thereby fixing the bottom circuit board 105 onto the edge surface of the backlight unit 101 with the central stripes 172 of the support members 107.

Subsequently, a rear LCD panel 102b connected with TCPs 104 is mounted on the rear surface of the backlight unit 101. A group of TCPs 104, which are connected to another circuit board 105, is then bent at the first slit 143 to allow the circuit board 105 to be in contact with the backside of the central stripes 172 of the support members 107. The hooks of the backward extensions 174 and the central stripes 172 of the support members 107 hold therebetween the bottom circuit board 105 at the suitable position thereof with respect to the edge surface of the backlight unit 101.

In the configuration of the double-sided LCD device 100c of the fourth embodiment, the circuit boards 105 need not have cutouts for the screws due to the structure of the support members 107, unlike the third embodiment. This allows the circuit board 105 to have a larger effective area for receiving therein the components and interconnects.

Figure 7A:
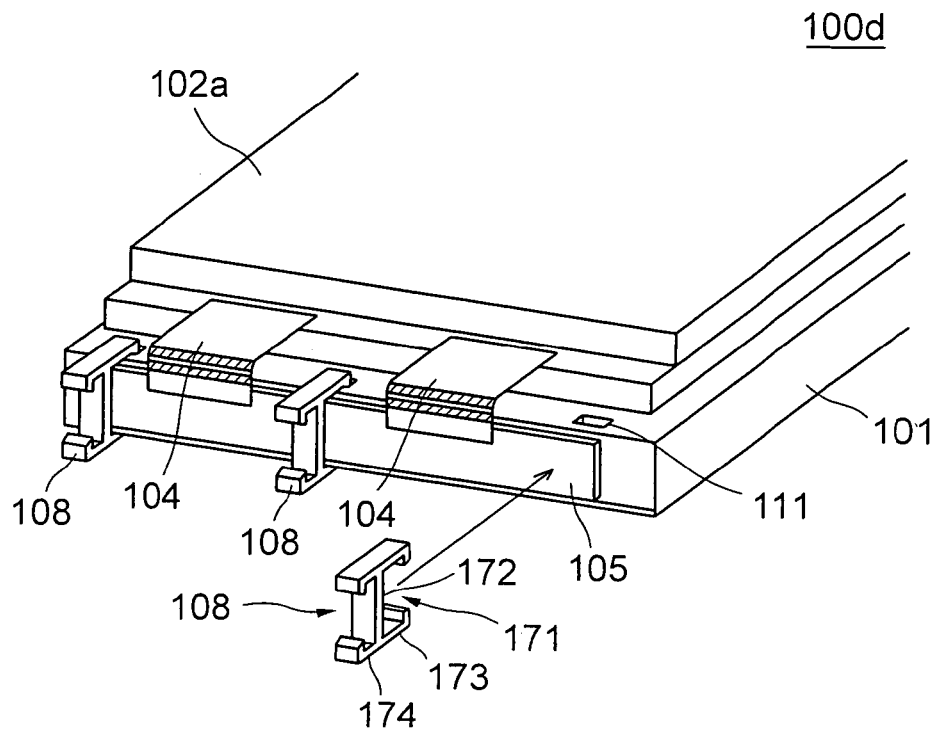
FIGS. 7A and 7B are perspective views showing, similarly to FIGS. 5A and 5B, respectively, a double-sided LCD device according to a fifth embodiment of the present invention.
Figure 7B:
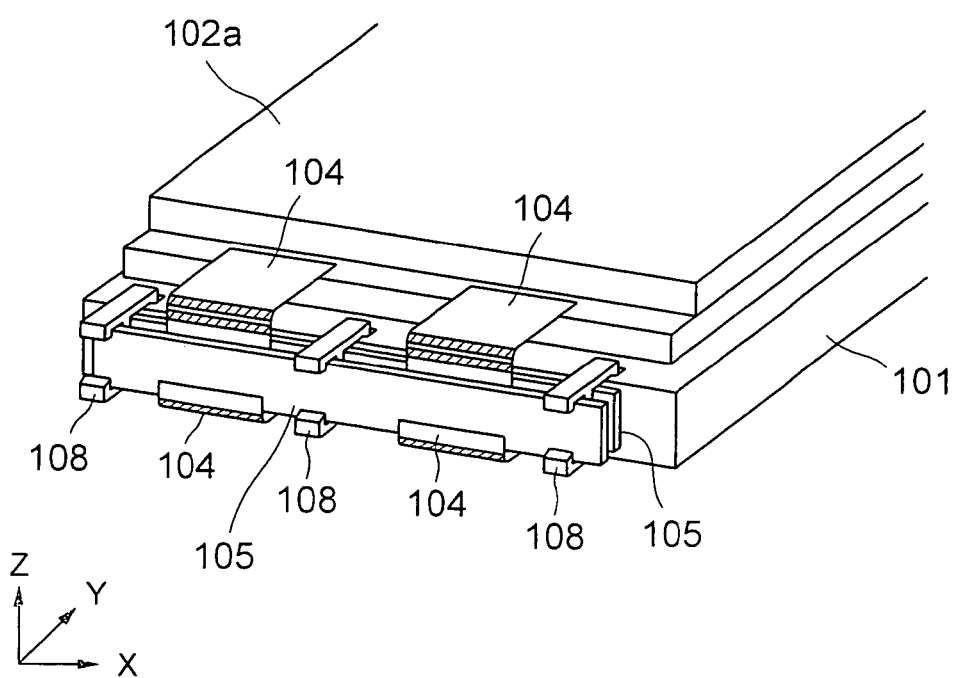

Referring to FIGS. 7A and 7B, a double-sided LCD device, generally designated by numeral 100d, according to a fifth embodiment of the present invention is similar to the fourth embodiment except for the structure of the support members. More specifically, the support member 108 in the present embodiment has a pair of backward extensions 174 in addition to the C-shaped portion 171 in the fourth embodiment. Each backward extension 174 has a hook at the tip thereof.

The top circuit board 105 connected to the rear LCD panel 102b is fixed by the opposing hooks of the backward extensions 174, after inserting the bottom circuit board 105 into the space between the opposing hooks in a snap-fit action. This structure allows the assembly of the LCD device 100d to be more stable compared to the fourth embodiment.

The above embodiments may be modified as desired. For example, the screws used in the third embodiment may be replaced by rivets, which may be inserted in the hole by hand. The TCP having the slit or slits may be replaced by a so-called chip-on-flexible substrate (tape). In the fourth and fifth embodiments, the holes receiving therein the hooks of the support members 107 and 108 may be replaced by protrusions formed on the backlight unit 101.

The group of TCPs 104 connected to each edge of a LCD panel may be connected to a single circuit board or a plurality circuit boards. If a plurality of circuit boards are connected to the LCD panel via respective TCPs, these TCPs may be bent at different slits.

Figure 8:
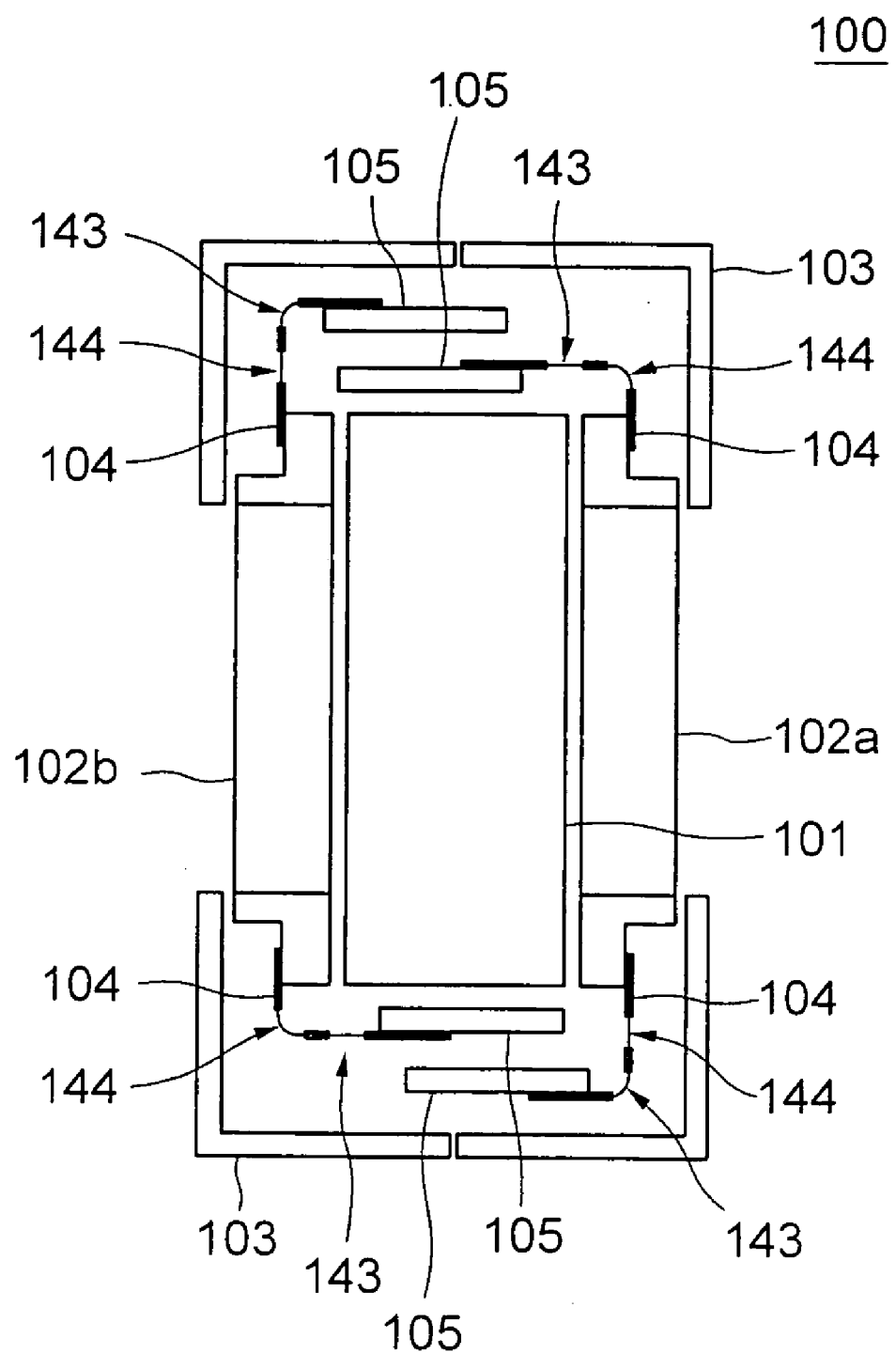
FIG. 8 is a sectional view of a double-sided LCD device modified from the double-sided LCD device of FIG. 1.
Figure 9:
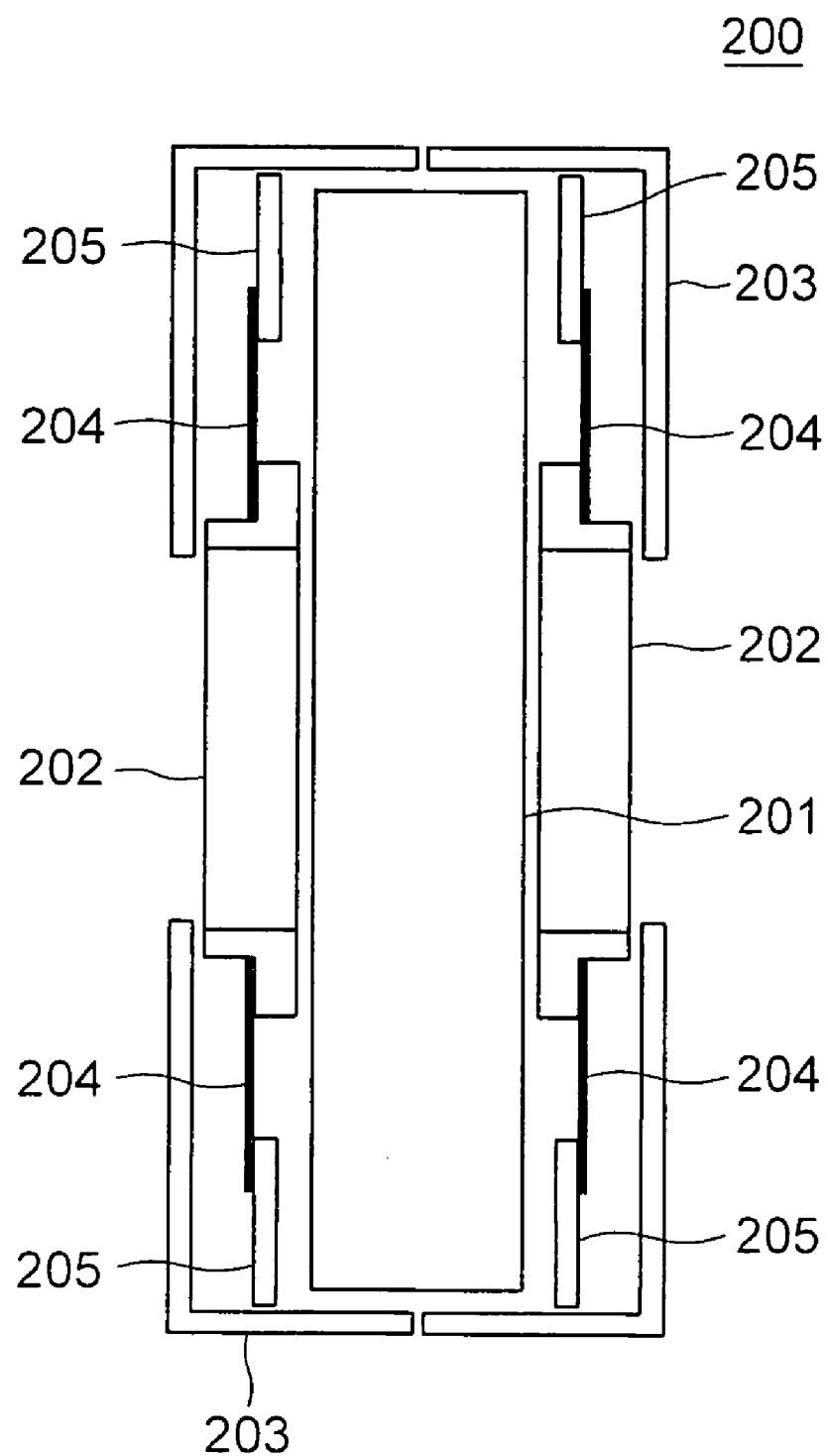
FIG. 9 is a sectional view of a conventional double-sided LCD device.
Figure 10:
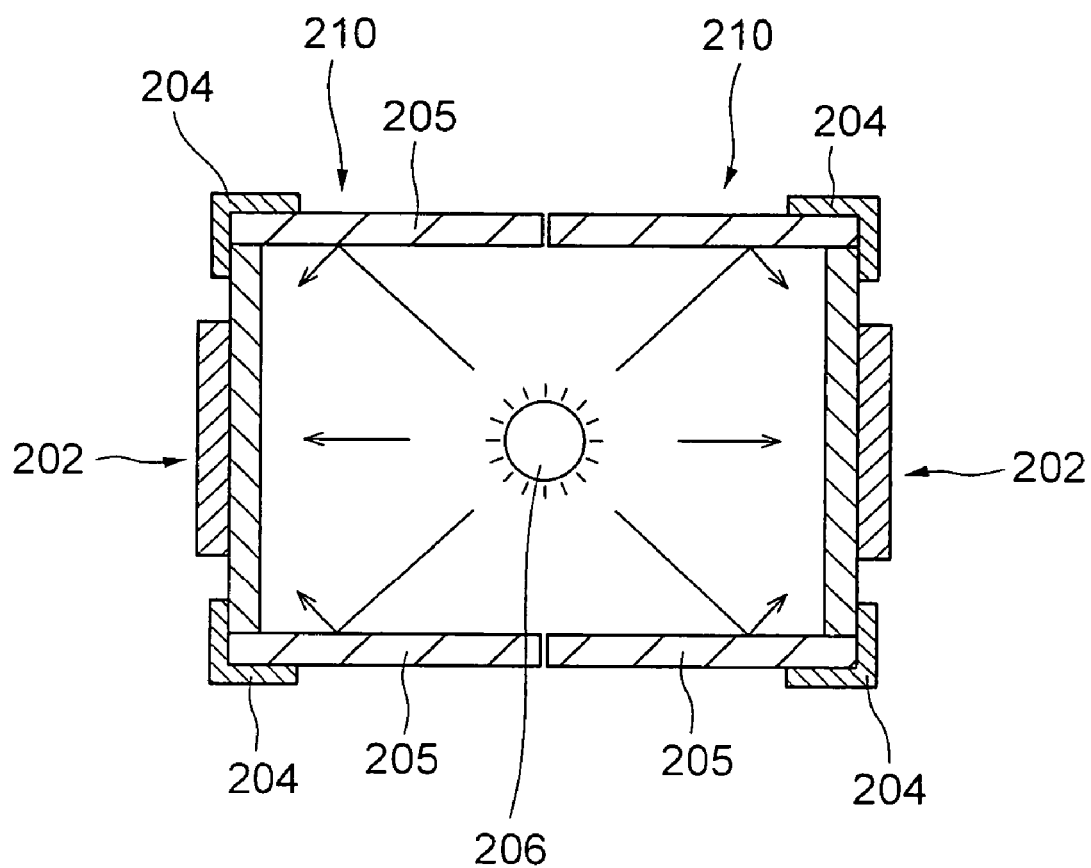
FIG. 10 is a sectional view of another conventional double-sided LCD device.
Figure 11:
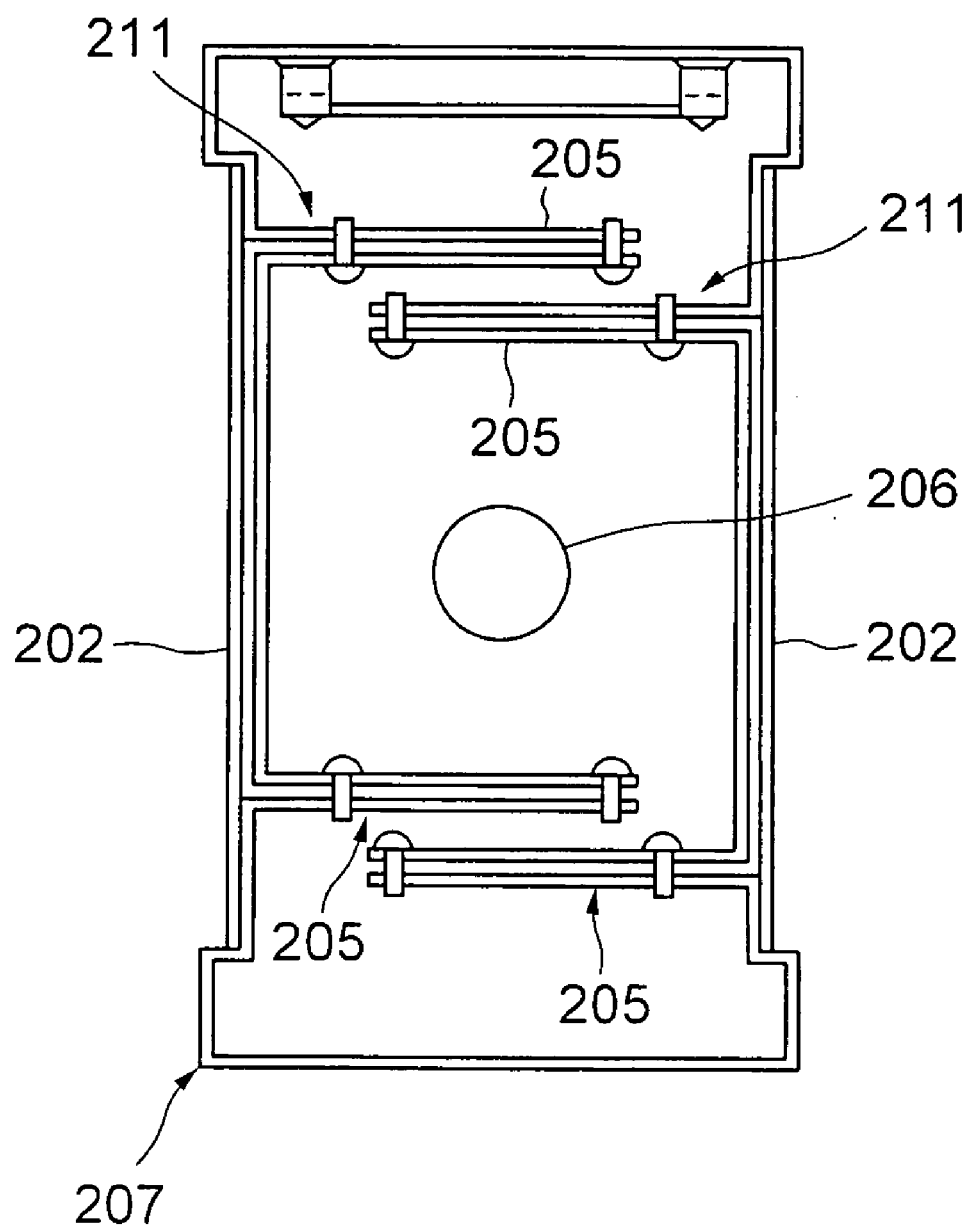
FIG. 11 is a sectional view of another conventional double-sided LCD device.

FIG. 8 shows a modification from FIG. 1. In this modification, the front TCPs 104 connected to the top edge of the front LCD panel 102a are bent at the second slits 144, whereas the front TCPs 104 connected to the bottom edge of the front LCD panel are bent at the first slits 143. For adapting this configuration for the front LCD panel 102a, the rear TCPs 104 connected to the top edge of the rear LCD panel 102b are bent at the first slits 143, whereas the rear TCPs 104 connected to the bottom edge of the rear LCD panel 102b are bent at the second slits 144.

Since the above embodiments are described only for examples, the present invention is not limited to the above embodiments and various other modifications or alterations can be easily made therefrom by those skilled in the art without departing from the scope of the present invention.

What is claimed is:

1. A double-sided liquid crystal display (LCD) device comprising:
    a backlight unit having front and rear light-emitting surfaces;
    front and rear LCD panels disposed on said front and rear light-emitting surfaces, respectively;
    first and second circuit boards disposed parallel to an edge surface of said backlight unit at different distances with respect to said edge surface; and
    front and rear tape carrier packages (TCPs), said front TCP connecting said front LCD panel to said first circuit board, said rear TCP connecting said rear LCD panel to said second circuit board, each of said TCPs having a plurality of bendable positions, said front and rear TCPs being bent at different bendable positions to achieve said different distances with respect to said edge surface.

2. The double-sided LCD device according to claim 1, wherein each of said TCPs has first and second slits as said bendable positions, and one and the other of said front and rear TCPs are bent at said first and second slits, respectively.

3. The double-sided LCD device according to claim 1, wherein each of said TCPs has a slit bendable at a plurality of bendable positions of said slit, and one and the other of said front and rear TCPs are bent at different bendable positions of said slit.

4. The double-sided LCD device according to claim 1, wherein said first and second circuit boards have a substantially common shape, and overlap with each other as viewed normal to said edge surface.

5. The double-sided LCD device according to claim 4, wherein one of said first and second circuit boards is disposed on said edge surface, and the other of said first and second circuit boards is disposed apart from said edge surface and said one of said first and second circuit boards.

6. The double-sided LCD device according to claim 5, wherein the other of said first and second circuit boards is disposed apart from said edge surface via a plurality of bosses.

7. The double-sided LCD device according to claim 5, wherein said first and second circuit boards are fixed to said backlight unit with a plurality of support members, and each of said support members includes a first section for fixing said one of said first and second circuit boards and at least one extension extending from said first section for supporting the other of said first and second circuit boards in association with said first section.

8. The double-sided LCD device according to claim 7, wherein said first section is a C-shaped stripe having a pair of opposing hooks received in a pair of holes formed on said backlight unit.

9. The double-sided LCD device according to claim 7, wherein said at least one extension include a pair of extensions sandwiching the other of said first and second circuit boards in a snap action.

* * * * *